(12) United States Patent
Li et al.

(10) Patent No.: US 11,336,258 B2
(45) Date of Patent: May 17, 2022

(54) BULK ACOUSTIC WAVE RESONATOR, MANUFACTURING METHOD OF THE SAME, AND FILTER

(71) Applicant: EPICMEMS(XIAMEN) CO. LTD, Fujian (CN)

(72) Inventors: Ping Li, Fujian (CN); Wei Wang, Fujian (CN); Nianchu Hu, Fujian (CN); Bin Jia, Fujian (CN)

(73) Assignee: Epicmems(Xiamen) Co. Ltd, Fujian (CN)

( * ) Notice: Subject to any disclaimer, the term of this patent is extended or adjusted under 35 U.S.C. 154(b) by 287 days.

(21) Appl. No.: 16/614,200

(22) PCT Filed: Jul. 26, 2018

(86) PCT No.: PCT/CN2018/097237
§ 371 (c)(1),
(2) Date: Nov. 15, 2019

(87) PCT Pub. No.: WO2020/019246
PCT Pub. Date: Jan. 30, 2020

(65) Prior Publication Data
US 2021/0359663 A1 Nov. 18, 2021

(51) Int. Cl.
*H03H 9/13* (2006.01)
*H03H 9/02* (2006.01)
(Continued)

(52) U.S. Cl.
CPC .............. *H03H 9/131* (2013.01); *H03H 3/02* (2013.01); *H03H 9/0211* (2013.01);
(Continued)

(58) Field of Classification Search
CPC ...... H03H 9/205; H03H 3/02; H03H 9/02015; H03H 9/0211; H03H 9/131; H03H 9/54
(Continued)

(56) References Cited

U.S. PATENT DOCUMENTS

2006/0066419 A1* 3/2006 Iwaki ................... H03H 9/0571
333/133
2015/0280100 A1 10/2015 Burak et al.
(Continued)

FOREIGN PATENT DOCUMENTS

CN 103166596 A 6/2013
CN 104953976 A 9/2015
(Continued)

OTHER PUBLICATIONS

International Search Report and Written Opinion of the International Searching Authority for International Patent Application No. PCT/CN2018/097237 dated Apr. 30, 2019, 9 pages.

*Primary Examiner* — Rakesh B Patel
*Assistant Examiner* — Jorge L Salazar, Jr.
(74) *Attorney, Agent, or Firm* — Merchant & Gould P.C.

(57) ABSTRACT

The present disclosure provides a bulk acoustic wave resonator, a manufacturing method thereof, and a filter, wherein the bulk acoustic wave resonator includes: a substrate; an acoustic reflection unit on the substrate; a piezoelectric stack structure on the acoustic reflection unit; and a pad on the piezoelectric stack structure; wherein the pad has an overlapping region with the acoustic reflection unit. The acoustic wave resonator, the manufacturing method thereof and the filter of the present disclosure can effectively reduce connection resistance of the bulk acoustic wave resonator, thereby reducing insertion loss of the filter.

4 Claims, 8 Drawing Sheets

(51) Int. Cl.
*H03H 3/02* (2006.01)
*H03H 9/205* (2006.01)
*H03H 9/54* (2006.01)

(52) U.S. Cl.
CPC ........ *H03H 9/02015* (2013.01); *H03H 9/205* (2013.01); *H03H 9/54* (2013.01)

(58) Field of Classification Search
USPC ........................................ 333/133, 187, 188
See application file for complete search history.

(56) References Cited

U.S. PATENT DOCUMENTS

| 2017/0179923 A1 | 6/2017 | Shin et al. |
| 2017/0346462 A1 | 11/2017 | Martin et al. |
| 2018/0123554 A1 | 5/2018 | Kyoung et al. |
| 2018/0183406 A1 | 6/2018 | Patil et al. |
| 2018/0183407 A1 | 6/2018 | Lee et al. |

FOREIGN PATENT DOCUMENTS

| CN | 106899275 A | 6/2017 |
| CN | 108023560 A | 5/2018 |
| CN | 108233888 A | 6/2018 |

* cited by examiner

BULK ACOUSTIC WAVE RESONATOR, MANUFACTURING METHOD OF THE SAME, AND FILTER

This application is a National Stage Application of PCT/CN2018/097237, filed 26 Jul. 2018, and which application is incorporated herein by reference. A claim of priority is made to the above-disclosed application.

TECHNICAL FIELD

The present disclosure relates to the field of radio frequency device technologies, and in particular, to a bulk acoustic wave resonator, a manufacturing method of the same, and a filter.

BACKGROUND

Surface Acoustic Wave Filter (SAW) and Film Bulk Acoustic Wave Filter (BAW) are currently two important technologies employed in a radio frequency (RF) filter of a smartphone.

With popularization of the 4th Generation mobile communication technology (4G)/Long Term Evolution (LTE) multi-band smartphone and trial operation of the 5th Generation mobile communication technology (5G), the frequency of mobile communication is getting higher, the bandwidth thereof is getting wider, and the performance requirements of the RF filter becomes stricter.

Bulk acoustic wave filters have been widely used in 4G communication due to their lower insertion loss, better roll-off characteristics, lower temperature coefficient, and greater power handling. However, with the trial operation of 5G, data transmission rate of mobile communication is getting greater, and spectrum resources are becoming more crowded. This, on one hand, requires the filter to have a wider bandwidth and, on the other hand, requires the filter to have better roll-off characteristics and lower insertion loss. Since the operating frequency of the bulk acoustic wave filter is inversely proportional to the thickness of film, electrodes of the bulk acoustic wave filter will become thinner at higher frequencies, which will in turn cause connection resistance to become larger, thereby affecting the insertion loss of the bulk acoustic wave filter. Therefore, it is of great importance to reduce the connection resistance of the bulk acoustic wave filter.

The bulk acoustic wave resonator is an element for constituting a bulk acoustic wave filter, and its basic structure includes a layer of piezoelectric film, a bottom electrode and a top electrode sandwiched between both sides of the piezoelectric film, and an acoustic reflection unit located under the bottom electrode. The overlapping region of the acoustic reflection unit, the bottom electrode, the top electrode, and the piezoelectric film forms an active region for the bulk acoustic wave resonator to operate. When a RF signal is applied between the electrodes, the piezoelectric film vibrates due to the inverse piezoelectric effect and generates sound waves that propagate in a direction perpendicular to the electrode surface and are reflected at the upper and lower interfaces. When the frequency of the applied RF signal is the same as the resonator frequency of the piezoelectric film, the RF signal can pass, thereby achieving the filtering effect.

Chinese Patent No. 103166596A (CN103166596A) discloses a resonator and a filter, wherein a thin film piezoelectric resonator includes a substrate E, an acoustic reflection structure D, a lower electrode B, a piezoelectric layer P, an upper electrode T and a connection structure C. The overlapping portion of the upper electrode T, the piezoelectric layer P, the lower electrode B, and the acoustic reflection structure D is defined as active region A of the thin film piezoelectric resonator. The upper electrode T includes a portion T1 in the active region and a leadout portion T2 as illustrated in FIG. 1. The connection structure C added to the resonator is outside the active region where the resonator operates (d is greater than or equal to 0.1 um), but the resistance of the signal passing through the electrode edge is not reduced, thus, the connection resistance of the resonator cannot be effectively reduced.

US Patent No. 20170346462 A1 (US20170346462A1) discloses a method of manufacturing a bulk acoustic wave resonator 70 including a substrate 71, a bottom electrode 72, a bottom electrode thickness increasing layer 73, an additional metal member 74, a PZ material layer 75, a first top electrode 76 and a second top electrode 77 as illustrated in FIG. 2. The bulk acoustic wave resonator manufacturing method can avoid the bottom electrode being etched too thin to affect the electrical connection when the contact hole of the piezoelectric film is etched. However, the additional metal is distributed outside the active region of the resonator, and therefore, the bottom electrode resistance between the additional metal and the active region cannot be reduced. Further, since the bottom electrode and the top electrode of the bulk acoustic wave resonator have thicknesses close to each other in general design of the bulk acoustic wave filter, the top electrode still has a relatively large electric resistance.

In summary, the existing bulk acoustic wave resonator has the following technical defects: although the connection resistance is reduced to some extent, the connection resistance is still large which would affect the performance, such as insertion loss etc., of the bulk acoustic wave filter; and with an increase in operating frequency, the thickness of the electrode of the bulk acoustic wave resonator will become thinner, and the resistance will become larger. The above effects are even more obvious in the high frequency bulk acoustic resonator and filter.

SUMMARY (1) Technical Problem to be Solved

The present disclosure provides a bulk acoustic wave resonator, a manufacturing method thereof, and a filter which can at least partially address the above-mentioned technical problems.

(2) Technical Solutions

According to an aspect of the present disclosure, there is provided a bulk acoustic wave resonator comprising: a substrate; an acoustic reflection unit on the substrate; a piezoelectric stack structure on the acoustic reflection unit; and a pad on the piezoelectric stack structure; wherein the pad has an overlapping region with the acoustic reflection unit.

In some embodiments, the piezoelectric stack structure includes: a bottom electrode; a piezoelectric film on the bottom electrode; and a top electrode on the piezoelectric film.

In some embodiments, the piezoelectric stack structure further includes a conductive thin film disposed above or under the bottom electrode, and the conductive thin film has an overlapping region with the acoustic reflection unit.

In some embodiments, the top electrode has an overlapping region of a width d5 with the conductive thin film; the overlapping region of the conductive thin film and the acoustic reflection unit has a width of d3; the distance between a non-connect edge of the top electrode and the acoustic reflection unit is d4; d3=d4+d5, d4≥0, d5=$k_1\lambda/4$, where $\lambda$ is an equivalent wavelength of the bulk acoustic wave resonator, and $k_1$ is an odd number.

In some embodiments, the pad is in contact with the top electrode at a connect edge of the top electrode, and the overlapping region of the pad and the acoustic reflection unit has a width of d6, d6=$k_2\lambda/4$, where $\lambda$ is an equivalent wavelength of the bulk acoustic wave resonator, $k_2$ is an odd number, and $k_1 \geq k_2$;

a contact hole is formed in the piezoelectric film and above the conductive thin film, and the bulk acoustic wave resonator further includes another pad formed at the contact hole to be in contact with the conductive thin film or the bottom electrode.

According to another aspect of the present disclosure, there is provided a filter including a plurality of bulk acoustic wave resonators which are cascaded.

According to another aspect of the present disclosure, there is provided a method of manufacturing a bulk acoustic wave resonator, comprising: forming an acoustic reflection unit on a substrate; forming a piezoelectric stack structure on the acoustic reflection unit; and forming a pad on the piezoelectric stack structure; wherein the pad has an overlapping region with the acoustic reflection unit.

In some embodiments, forming a piezoelectric stack structure on the acoustic reflection unit includes: forming a bottom electrode on the acoustic reflection unit; forming a piezoelectric film on the bottom electrode; and forming a top electrode on the piezoelectric film.

In some embodiments, before or after forming the bottom electrode, the method further includes forming a conductive thin film, the conductive thin film having an overlapping region with the acoustic reflection unit.

In some embodiments, the top electrode has an overlapping region of a width d5 with the conductive thin film; the overlapping region of the conductive thin film and the acoustic reflection unit has a width of d3; the distance between a non-connect edge of the top electrode and the acoustic reflection unit is d4; d3=d4+d5, d4≥0, d5=$k_1\lambda/4$, where $\lambda$ is an equivalent wavelength of the bulk acoustic wave resonator, and $k_1$ is an odd number;

the overlapping region of the pad and the acoustic reflection unit has a width of d6, d6=$k_2\lambda/4$, where $\lambda$ is the equivalent wavelength of the bulk acoustic wave resonator, $k_2$ is an odd number, and $k_1 \geq k_2$.

(3) Advantages

As can be seen from the above technical solutions that, the acoustic wave resonator, the manufacturing method thereof and the filter of the present disclosure have at least one of the following advantages.

(1) In the present disclosure, by introducing a conductive thin film and causing the pad to have an overlapping region with the acoustic reflection unit, the pad is extended into the active region of the bulk acoustic wave resonator, the electrode thickness of a circuit connecting the bottom electrode and the top electrode of the bulk acoustic wave resonator is increased, and the connection resistance of the bulk acoustic wave resonator is effectively reduced, thereby enabling reducing insertion loss of filters and duplexers formed by cascading of such resonators.

(2) In the present disclosure, by setting widths of respective overlapping regions and a distance between the non-connect edge of the top electrode and the acoustic reflection unit, a region with a discontinuous acoustic impedance is formed at the edge of the active region of the acoustic wave resonator, thereby reflecting acoustic wave energy that is leaked from the edge, and improving quality factor of the bulk acoustic wave resonator.

BRIEF DESCRIPTION OF THE DRAWINGS

In order to more clearly illustrate the technical solutions in the embodiments of the present disclosure, the accompanying drawings to be used in the description of the embodiments will be briefly described below. It is apparent to those skilled in the art that, the accompanying drawings illustrated below are merely embodiments of the present disclosure, and other drawings may be obtained by those skilled in the art based on the illustrated accompanying drawings without creative efforts.

DETAILED DESCRIPTION

To make the objects, technical solutions and advantages of the present disclosure more apparent, the present disclosure will be further described in detail below in conjunction with specific embodiments thereof and with reference to the accompanying drawings.

The specific embodiments and the accompanying drawings are merely for a better understanding of the disclosure and are not intended to limit the scope of the disclosure. Respective constituent elements of structures illustrated in the accompanying drawings are not scaled according to scale factors and thus do not represent the actual relative sizes of respective structures in the embodiments.

The present disclosure provides a bulk acoustic wave resonator including a substrate, an acoustic reflection unit on the substrate, a piezoelectric stack structure on the acoustic reflection unit, and a pad on the piezoelectric stack structure. The pad has a region overlapped with the acoustic reflection unit.

Figure 1:
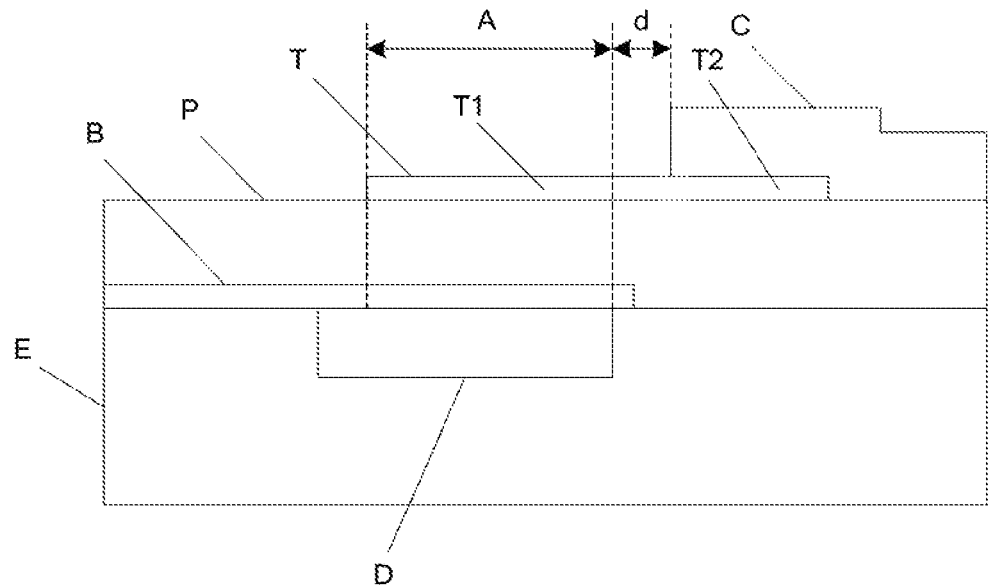
FIG. 1 is a schematic view illustrating a structure of a conventional bulk acoustic wave resonator.
Figure 2:
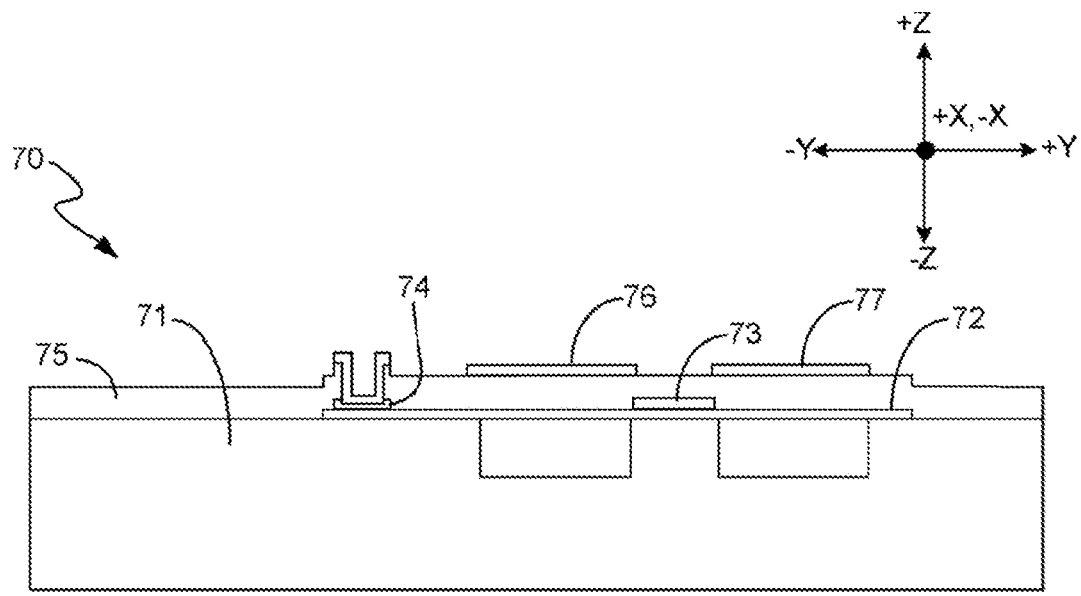
FIG. 2 is another schematic view illustrating the structure of a conventional bulk acoustic wave resonator.
Figure 3:
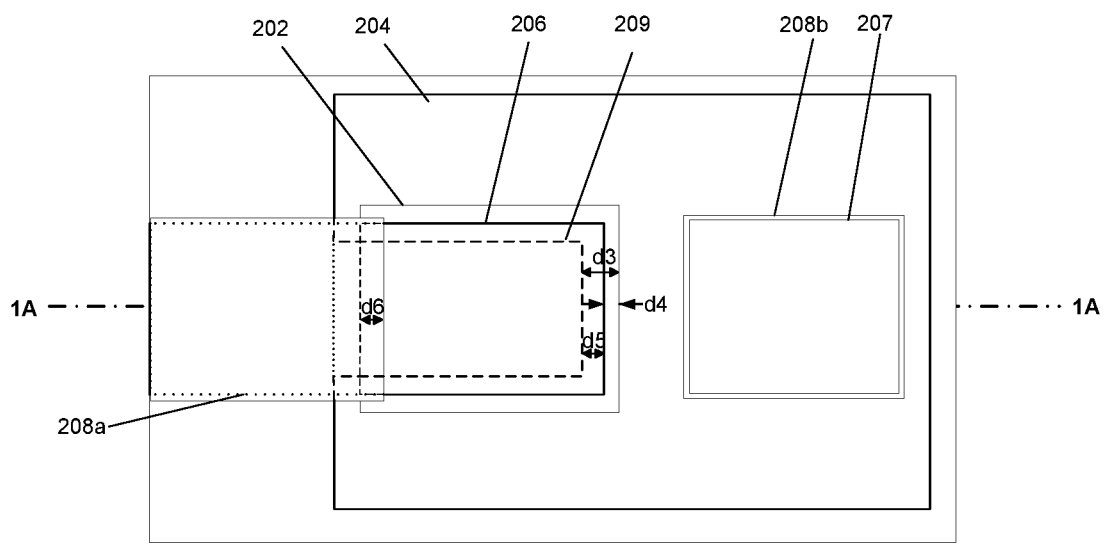
FIG. 3 is a top plan view of a bulk acoustic wave resonator according to an embodiment of the present disclosure.
Figure 4:
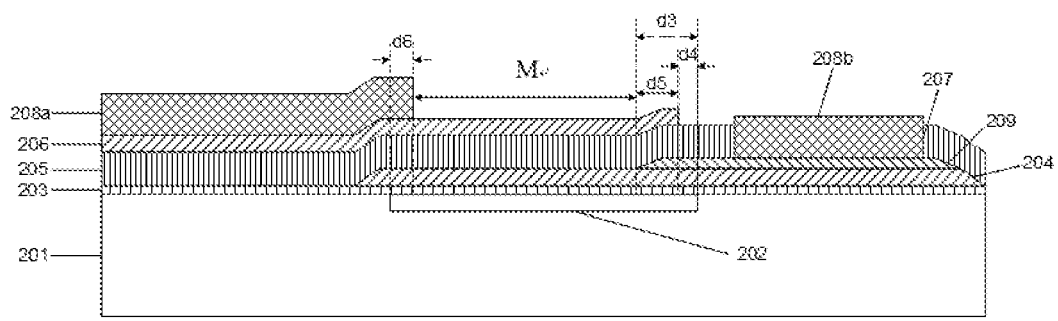
FIG. 4 is a cross-sectional view taken along a line 1A-1A of FIG. 3.

In a specific embodiment described in conjunction with FIGS. 3 and 4, the bulk acoustic wave resonator includes:

a substrate 201;

an acoustic reflection unit 202 formed on the substrate; wherein materials having different acoustic impedances may be alternately stacked on a front surface of the substrate to manufacture a Bragg reflection layer, thereby forming the acoustic reflection unit; alternatively, the substrate may be etched to form a recess on the substrate, the recess may be filled with a sacrificial material, and then polished via Chemical Mechanical Polishing (CMP) to make the surface of the sacrificial material flush with the surface of the substrate, thereby forming the acoustic reflection unit; the latter is applied in this embodiment;

an isolation layer/support layer 203 formed on the acoustic reflection unit; wherein the isolation layer may completely cover the front surface of the substrate and the acoustic reflection unit, or only partially cover the front surface of the substrate, i.e., the isolation layer may be selectively etched together with etching of a bottom electrode or not etched;

a bottom electrode 204 formed on the isolation layer; wherein the bottom electrode partially covers the front surface of the isolation layer, or completely covers the front surface of the isolation layer;

a conductive thin film 209 formed on the bottom electrode; wherein the conductive thin film partially covers the front surface of the bottom electrode;

a piezoelectric film 205 formed on the conductive thin film; wherein the piezoelectric film is etched to form a contact hole 207 in the piezoelectric film, and the contact hole is formed above the conductive thin film;

a top electrode 206 formed on the piezoelectric film, wherein the top electrode 206 partially covers the piezoelectric film; and a pad 208a on the top electrode and another pad 208b at the contact hole 207.

Further referring to FIG. 4, the bottom electrode 204 may partially or completely overlie the acoustic reflection unit 202, and the piezoelectric film 205 may overlie the entire bottom electrode 204 except for the part where the contact hole 207 is located. The pads 208a and 208b are in contact with the top electrode 206 and the conductive thin film 209, respectively. The conductive thin film 209 overlies the bottom electrode 204 except for a connect edge of the top electrode 206 (the edge in contact with the pad 208a) and an illustrated M region, and has a region overlapped with a non-connect edge of the top electrode (the edge not in contact with the pad 208a).

The overlapping region of the conductive thin film 209 and the acoustic reflection unit 202 has a width of d3, and the distance from the non-connect edge of the top electrode 206 to the acoustic reflection unit 202 (an edge of the acoustic reflection unit 202 away from the pad 208a) is d4, and the overlapping region of the conductive thin film 209 and the top electrode 206 has a width of d5, where d3=d4+d5, d4≥0, and d5=$k_1$ λ/4, λ is an equivalent wavelength of the bulk acoustic wave resonator, and k1 is an odd number. The pad 208a is in contact with the top electrode 206 at the connect edge of the top electrode, and extends to be overlapped with the acoustic reflection unit 202. The overlapping region has a width of d6, d6=$k_2$λ/4, where λ is the equivalent wavelength of the bulk acoustic wave resonator, $k_2$ is an odd number, and $k_1 \geq k_2$. In this way, without any influence on the area of the effective working region, on the one hand, the electrode thickness of a circuit connecting the bottom electrode and the top electrode is increased, thereby effectively reducing the connection resistance of the bulk acoustic wave resonator; and on the other hand, a region with a discontinuous acoustic impedance is formed at the edge of the active region of the acoustic wave resonator, and the acoustic wave energy that may be leaked from the edge can be reflected effectively, thereby improving quality factor of the bulk acoustic wave resonator.

The material of the conductive thin film 209 may be the same as that of the electrodes 204, 206 of the bulk acoustic wave resonator, such as molybdenum (Mo), tungsten (W), ruthenium (Ru), iridium (Ir), etc., or may be different, such as Gold (Au), platinum (Pt), copper (Cu), aluminum (Al), graphene, carbon nanotubes (CNT), etc., all of which has a relatively smaller resistivity.

In this embodiment, there is provided a method for manufacturing the bulk acoustic wave resonator according to the present embodiment, which is illustrated in conjunction with FIGS. 5A-5H. The method for manufacturing the bulk acoustic wave resonator includes the following steps.

Figure 5A:
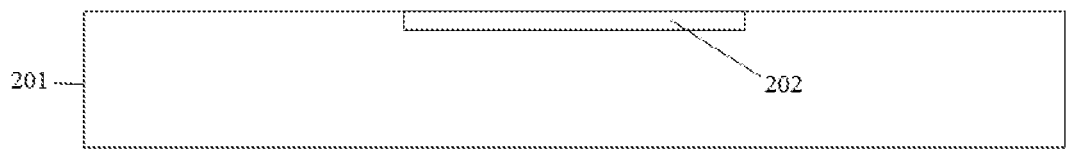
FIGS. 5A to 5H are flowcharts illustrating a process of manufacturing a bulk acoustic wave resonator according to an embodiment of the present disclosure.

S1, forming an acoustic reflection unit 202. Specifically, an acoustic reflection unit 202 is formed on the substrate. Materials having different acoustic impedances may be alternately stacked on a front surface of the substrate to form a Bragg reflection layer, thereby forming the acoustic reflection unit. Alternatively, the substrate may be etched to form a recess on the substrate. The recess may be filled with a sacrificial material, and then polished via Chemical Mechanical Polishing (CMP) to make the surface of the sacrificial material flush with the surface of the substrate, thereby forming the acoustic reflection unit. The latter is applied in this embodiment as illustrated in FIG. 5A.

Figure 5B:
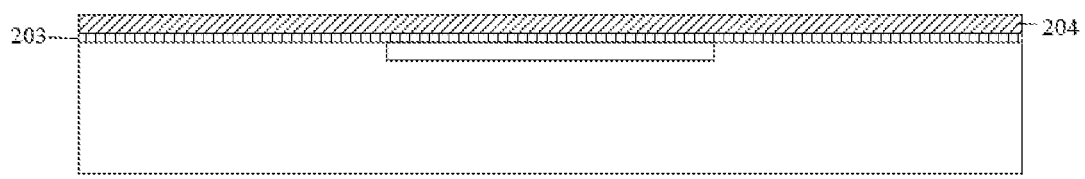

S2, depositing an isolation layer 203 and a bottom electrode 204. Specifically, an isolation layer 203 is formed on the acoustic reflection unit, and a bottom electrode 204 is formed on the isolation layer, as illustrated in FIG. 5B.

Figure 5C:
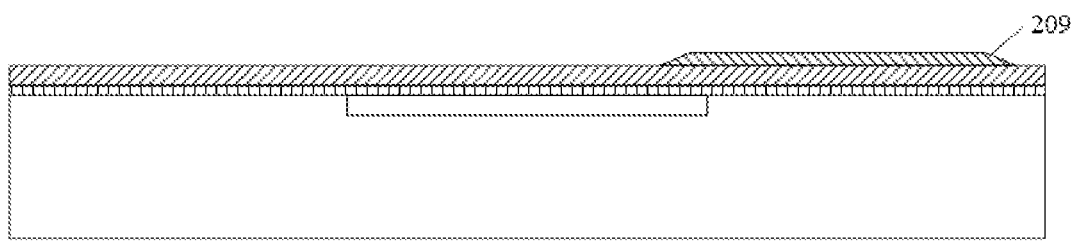

S3, depositing and patterning a conductive thin film 209. Preferably, a lift off process is used here, in which a pattern of the conductive thin film 209 is formed via photolithography (there is no photoresist coverage at the position of the conductive thin film 209), a layer of conductive thin film is deposited, and then the photoresist and the conductive thin film on the photoresist are removed, thereby forming the conductive thin film 209 as illustrated in FIG. 5C.

Figure 5D:
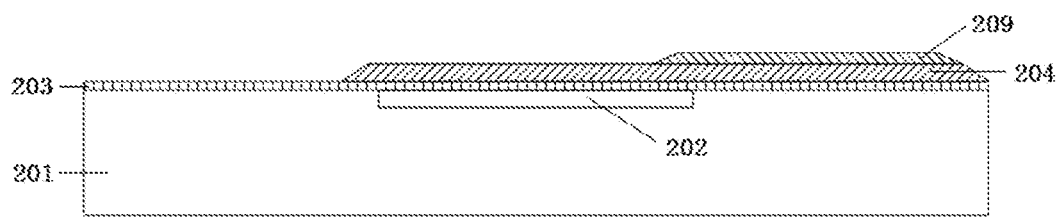

S4, patterning the bottom electrode 204 as illustrated in FIG. 5D.

Figure 5E:
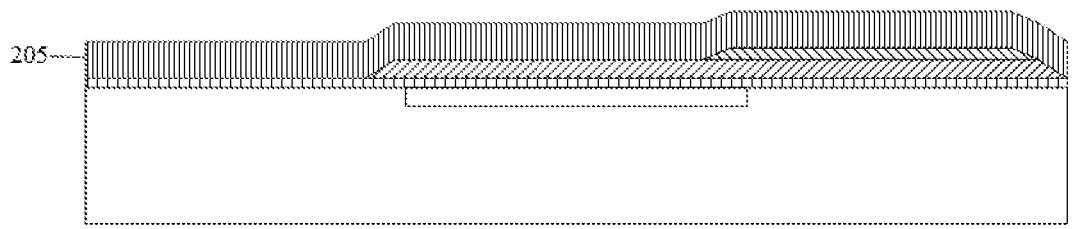

S5, depositing a piezoelectric film 205. Specifically, a piezoelectric film 205 is formed on the conductive thin film as illustrated in FIG. 5E.

Figure 5F:
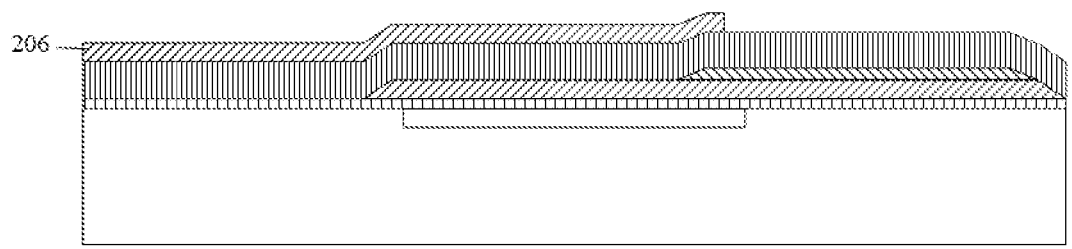

S6, depositing and patterning a top electrode 206 as illustrated in FIG. 5F.

Figure 5G:
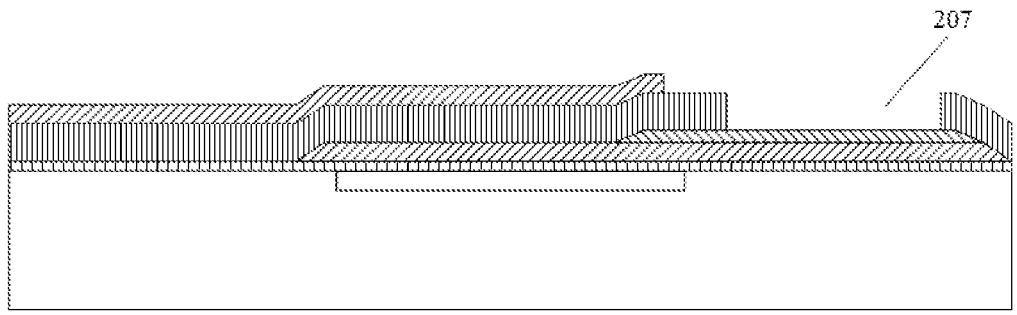

S7, etching the piezoelectric film to form a contact hole 207 as illustrated in FIG. 5G.

Figure 5H:
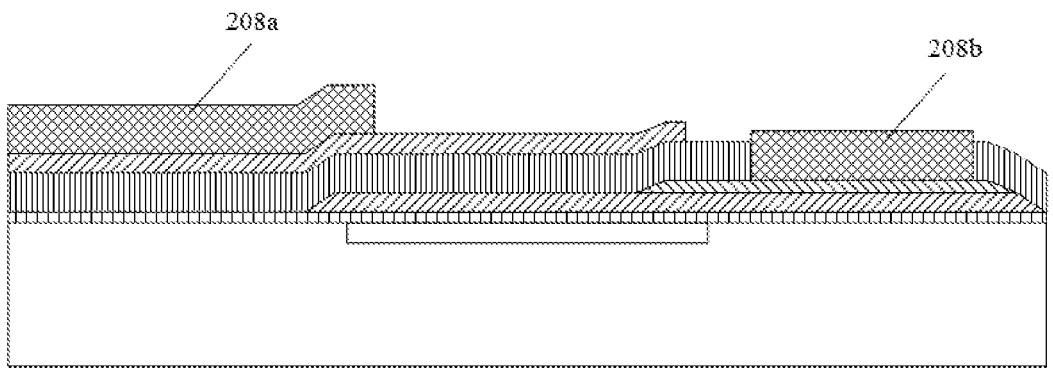

S8, forming pads 208a and 208b. The pad 208a is situated on the top electrode and the pad 208b is situated at the contact hole as illustrated in FIG. 5H.

Figure 6:
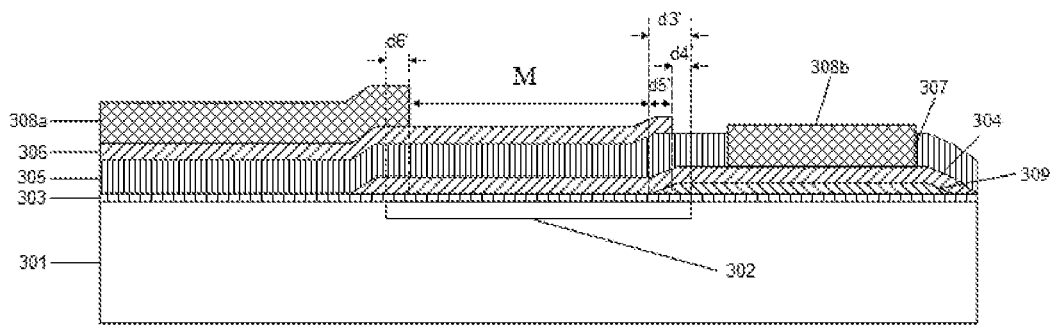
FIG. 6 is a cross-sectional view illustrating a bulk acoustic wave resonator according to another embodiment of the present disclosure.

In another specific embodiment, the structure of the bulk acoustic wave resonator is illustrated in FIG. 6. The bulk acoustic wave resonator may include: an acoustic reflection unit 302 on a substrate 301; an isolation layer/support layer 303 on the acoustic reflection unit 302; a bottom electrode 304 on the isolation layer/support layer 303, wherein the bottom electrode 304 partially or completely overlies the acoustic reflection unit 302; a piezoelectric film 305 on the bottom electrode 304, wherein the piezoelectric film 305 overlies the entire bottom electrode 304 except for the part where the contact hole 307 is located; a top electrode 306 partially overlying the piezoelectric film 305; and pads 308a and 308b in contact with the top electrode 306 and the bottom electrode 304, respectively. The bulk acoustic wave resonator further includes a conductive thin film 309 under the bottom electrode 304. The conductive thin film 309 is situated under the bottom electrode 304 except for the connect edge of the top electrode 306 (the edge in contact with the pad 308a) and the illustrated M region.

The overlapping region of the conductive thin film 309 and the acoustic reflection unit 302 has a width of d3', the distance from the non-connect edge of the top electrode 306 to the acoustic reflection unit 302 is d4', and the overlapping region of the conductive thin film 309 and the top electrode 306 has a width of d5', where d3'=d4'+d5', d4'≥0, and d5'=$k_1\lambda/4$, $\lambda$ is an equivalent wavelength of the bulk acoustic wave resonator, and $k_1$ is an odd number.

The pad 308a is in contact with the top electrode 306 at the connect edge of the top electrode, and extends to be overlapped with the acoustic reflection unit 302. The overlapping region has a width of d6', d6=$k_2\lambda/4$, where $\lambda$ is the equivalent wavelength of the bulk acoustic wave resonator, $k_2$ is an odd number, and $k_1 \geq k_2$.

The material of the conductive thin film 309 may be the same as that of the electrodes 304, 306 of the bulk acoustic wave resonator, such as molybdenum (Mo), tungsten (W), ruthenium (Ru), iridium (Ir), etc., or may be different, such as Gold (Au), platinum (Pt), copper (Cu), aluminum (Al), graphene, carbon nanotubes (CNT), etc., all of which has a relatively smaller resistivity.

In this embodiment, there is provided a method for manufacturing the bulk acoustic wave resonator according to the present embodiment, which is illustrated in conjunction with FIGS. 7A-7H. The method for manufacturing the bulk acoustic wave resonator includes the following steps.

Figure 7A:
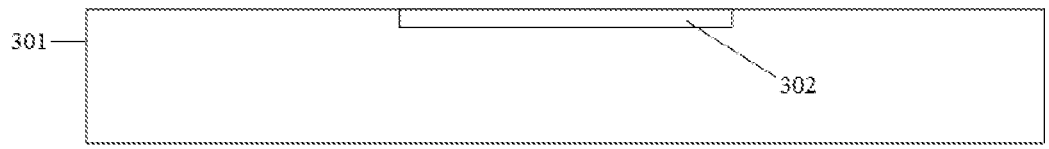
FIGS. 7A to 7H are flowcharts illustrating a process of manufacturing a bulk acoustic wave resonator according to another embodiment of the present disclosure.

S1, manufacturing an acoustic reflection unit 302 as illustrated in FIG. 7A.

Figure 7B:
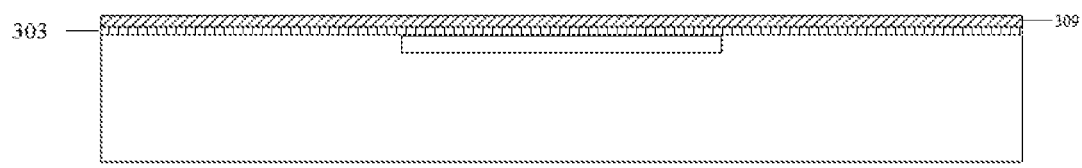

S2, depositing an isolation layer 303 and a conductive thin film 309 as illustrated in FIG. 7B.

Figure 7C:
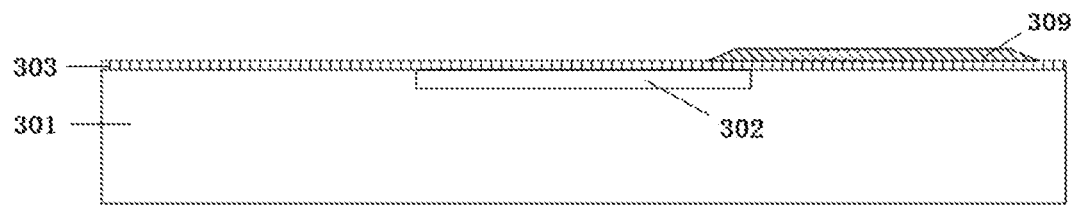

S3, patterning a conductive thin film 309 as illustrated in FIG. 7C. Specifically, an etching process or a lift off process may be used here.

Figure 7D:
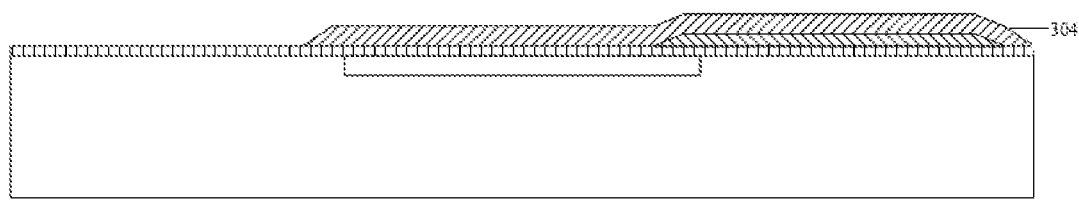

S4, depositing and patterning a bottom electrode 304 as illustrated in FIG. 7D.

Figure 7E:
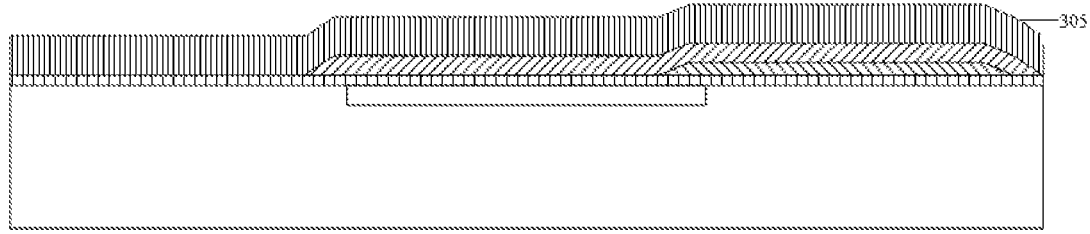

S5, depositing a piezoelectric film 305 as illustrated in FIG. 7E.

Figure 7F:
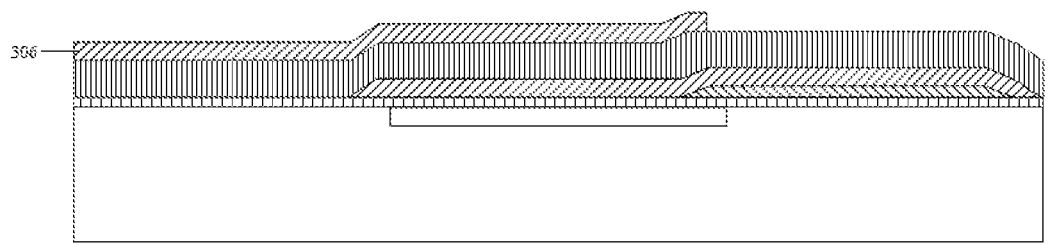

S6, depositing and patterning a top electrode 306 as illustrated in FIG. 7F.

Figure 7G:
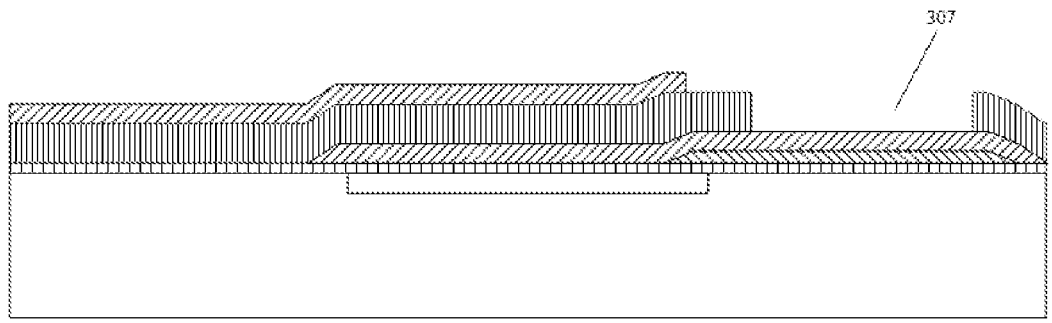

S7, etching the piezoelectric film 305 to form a contact hole 307 as illustrated in FIG. 7G.

Figure 7H:
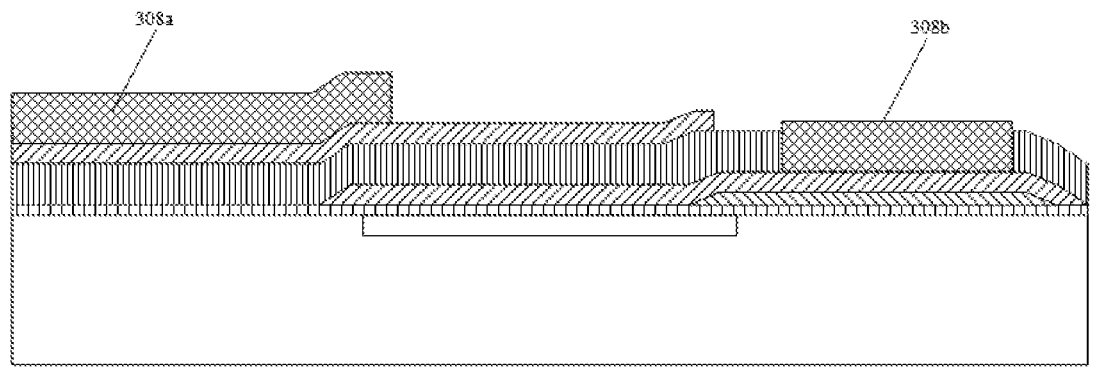

S8, forming pads 308a and 308b as illustrated in FIG. 7H.

The present embodiment is the same as the foregoing embodiment except that, in the present embodiment, the conductive thin film is situated under the bottom electrode, while in the foregoing embodiment, the conductive thin film is situated on the bottom electrode.

Figure 8:
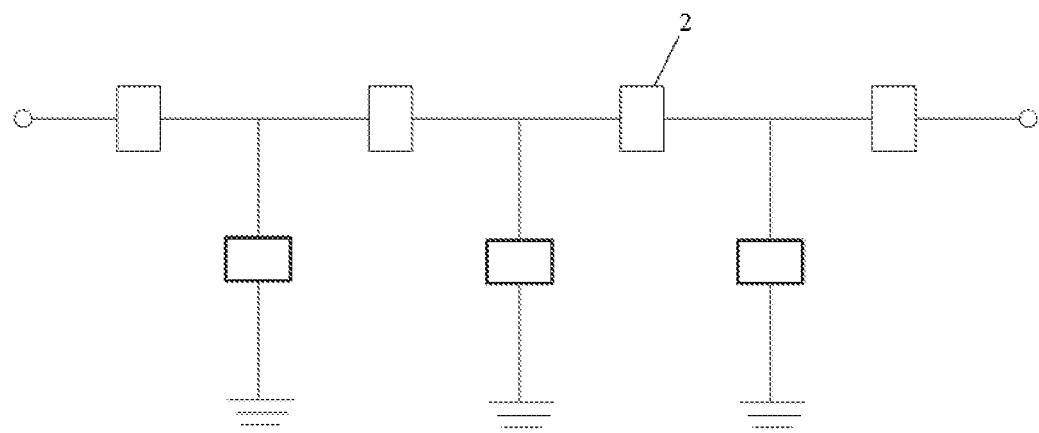
FIG. 8 is a schematic view illustrating a structure of a filter according to an embodiment of the present disclosure.

As illustrated in FIG. 8, the present disclosure also provides a filter including a plurality of bulk acoustic wave resonators 2 that are cascaded.

In addition, the above definitions of the various elements and methods are not limited to the specific structures, shapes or manners mentioned in the embodiments, and those skilled in the art can simply modify or replace them, for example:

(1) The bulk acoustic wave resonator may not include the isolation layer.

(2) The bulk acoustic wave resonator may further include a passivation layer covering a part of the top electrode that is not in contact with the pad and a part of the bottom electrode that is not covered by the pad and the piezoelectric film.

(3) The shape of the active region of the bulk acoustic wave resonator may be square, rectangle, irregular polygon, circle or ellipse.

Heretofore, the embodiments of the present disclosure have been described in detail in conjunction with the accompanying drawings. Based on the above description, those skilled in the art should have a clear understanding of the present disclosure.

It should be noted that the implementations that are not illustrated or described in the drawings or the detailed description of the specification are all known to those of ordinary skill in the art and are not described in detail. In addition, the above definitions of the various elements are not limited to the specific structures and shapes mentioned in the embodiments, and those skilled in the art may simply change or replace them. There are proposed herein examples of parameters such as specific values, however, such parameters need not be exactly equal to corresponding values, but may approximate the corresponding values within acceptable error tolerances or design constraints. Directional terms mentioned in the examples, such as "on", "under", "front", "back", "left", "right", etc., are merely referring to the directions of the drawings, and are not intended to limit the scope of the present disclosure. The above embodiments may be combined with each other or combined with other embodiments based on design and reliability considerations, that is, technical features in different embodiments can be freely combined to form more embodiments.

The above description of the disclosed embodiments enables those skilled in the art to implement or practice the present application. Various modifications to these embodiments are obvious to those skilled in the art, and the general principles defined herein may be implemented in other embodiments without departing from the spirit or scope of the application. Therefore, the present disclosure is not intended to be limited to the embodiments illustrated herein, but conform to the widest scope in consistent with the principles and novel features disclosed herein.

It should be noted that the implementations that are not illustrated or described in the drawings or the detailed description of the specification are all known to those of ordinary skill in the art and are not described in detail. In addition, the above definitions of the various elements and methods are not limited to the specific structures, shapes or manners mentioned in the embodiments, and those skilled in the art can simply modify or replace them.

The specific embodiments described above further explain the objectives, technical solutions and beneficial effects of the present disclosure in detail. It is to be understood that the foregoing description is only illustrative of the embodiments of the present invention, but is not intended to limit the scope of the disclosure, and any modifications, equivalents, improvements, etc., within the spirit and principles of the present disclosure should fall within the scope of this disclosure.

The invention claimed is:

1. A bulk acoustic wave resonator, comprising:
a substrate;
an acoustic reflection unit on the substrate;
a piezoelectric stack structure on the acoustic reflection unit; and
a pad on the piezoelectric stack structure;
wherein the pad has an overlapping region with the acoustic reflection unit,
wherein the piezoelectric stack structure comprises:
a bottom electrode;
a piezoelectric film on the bottom electrode;
a top electrode on the piezoelectric film,
wherein the piezoelectric stack structure further comprises a conductive thin film disposed above or under the bottom electrode, the conductive thin film has an overlapping region with the acoustic reflection unit, and wherein the top electrode has an overlapping region of a width d5 with the conductive thin film; the overlapping region of the conductive thin film and the acoustic reflection unit has a width of d3; the distance between a non-connect edge of the top electrode and the acoustic reflection unit is d4; d3=d4+d5, d4≥0, d5=$k_1\lambda/4$, where $\lambda$ is an equivalent wavelength of the bulk acoustic wave resonator, and $k_1$ is an odd number.

2. The bulk acoustic wave resonator of claim 1, wherein the pad is in contact with the top electrode at a connect edge of the top electrode, and the overlapping region of the pad and the acoustic reflection unit has a width of d6, d6=$k_2\lambda/4$, where $\lambda$ is an equivalent wavelength of the bulk acoustic wave resonator, $k_2$ is an odd number, and $k_1 \geq k_2$;

a contact hole is formed in the piezoelectric film and above the conductive thin film, and the bulk acoustic wave resonator further comprises another pad formed at the contact hole to be in contact with the conductive thin film or the bottom electrode.

3. A filter comprising a plurality of bulk acoustic wave resonators according to claims 1 or 2, wherein the plurality of bulk acoustic wave resonators are cascaded.

4. A method of manufacturing a bulk acoustic wave resonator, comprising:

forming an acoustic reflection unit on a substrate;

forming a piezoelectric stack structure on the acoustic reflection unit; and forming a pad on the piezoelectric stack structure;

wherein the pad has an overlapping region with the acoustic reflection unit, wherein forming a piezoelectric stack structure on the acoustic reflection unit comprises:

forming a bottom electrode on the acoustic reflection unit;

forming a piezoelectric film on the bottom electrode; and forming a top electrode on the piezoelectric film, wherein before or after forming the bottom electrode, the method further comprises: forming a conductive thin film, the conductive thin film having an overlapping region with the acoustic reflection unit, and wherein the top electrode has an overlapping region of a width d5 with the conductive thin film; the overlapping region of the conductive thin film and the acoustic reflection unit has a width of d3; the distance between a non-connect edge of the top electrode and the acoustic reflection unit is d4; d3=d4+d5, d4≥0, d5=$k_1\lambda/4$, where $\lambda$ is an equivalent wavelength of the bulk acoustic wave resonator, and $k_1$ is an odd number;

the overlapping region of the pad and the acoustic reflection unit has a width of d6, d6=$k_2\lambda/4$, where $\lambda$ is an equivalent wavelength of the bulk acoustic wave resonator, $k_2$ is an odd number, and $k_1 \geq k_2$.

* * * * *